(12) United States Patent
Hermes et al.

(10) Patent No.: US 11,012,789 B2
(45) Date of Patent: May 18, 2021

(54) MEMS MICROPHONE SYSTEM

(71) Applicants: Robert Bosch Gmbh, Stuttgart (DE); Akustica, Inc., Pittsburgh, PA (US)

(72) Inventors: Christoph Hermes, Kirchentellinsfurt (DE); Bernhard Gehl, Wannweil (DE); Arnim Hoechst, Reutlingen (DE); Daniel Meisel, Pittsburgh, PA (US); Andrew Doller, Sharpsburg, PA (US); Yujie Zhang, Sunnyvale, CA (US); Gokhan Hatipoglu, Pittsburgh, PA (US)

(73) Assignees: Akustica, Inc., Pittsburgh, PA (US); Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/021,511

(22) Filed: Jun. 28, 2018

(65) Prior Publication Data

US 2019/0098418 A1    Mar. 28, 2019

Related U.S. Application Data

(60) Provisional application No. 62/561,947, filed on Sep. 22, 2017.

(51) Int. Cl.
*H04R 19/04* (2006.01)
*H04R 19/00* (2006.01)
(Continued)

(52) U.S. Cl.
CPC ............ *H04R 19/04* (2013.01); *H04R 7/10* (2013.01); *H04R 19/005* (2013.01);
(Continued)

(58) Field of Classification Search
CPC .................................................. H04R 19/005
(Continued)

(56) References Cited

U.S. PATENT DOCUMENTS 8,577,063 B2 * 11/2013 Yang ................... B81B 7/0061
381/175
9,002,038 B2 * 4/2015 Ochs ...................... H04R 23/00
381/174
(Continued)

FOREIGN PATENT DOCUMENTS

DE    10 2014 217 152 A1    3/2016
KR    10-1688954    * 12/2016 ............ H04R 19/00
KR    101688954 B1    12/2016

OTHER PUBLICATIONS

International Search Report and Written Opinion corresponding to International Patent Application No. PCT/US2018/040002 (12 pages).

*Primary Examiner* — Suhan Ni
(74) *Attorney, Agent, or Firm* — Maginot, Moore & Beck LLP

(57) ABSTRACT

A MEMS microphone includes a substrate, a lower membrane supported on the substrate, an upper membrane suspended above the lower membrane, a first electrode supported on the lower membrane, and a second electrode supported on the upper membrane. The lower membrane and the upper membrane enclose a cavity in which the first electrode and the second electrode are located. The lower membrane and the upper membrane are each formed of silicon carbonitride (SiCN). The first electrode and the second electrode are each formed of polysilicon.

6 Claims, 6 Drawing Sheets

(51) Int. Cl.
  *H04R 7/10* (2006.01)
  *H04R 31/00* (2006.01)
(52) U.S. Cl.
  CPC ... *B81B 2201/0257* (2013.01); *B81B 2203/04* (2013.01); *H04R 31/003* (2013.01); *H04R 2201/003* (2013.01); *H04R 2307/025* (2013.01)
(58) Field of Classification Search
  USPC .......................................... 381/175; 257/416
  See application file for complete search history.

(56) References Cited

U.S. PATENT DOCUMENTS

| | | |
|---|---|---|
| 9,181,080 B2 | 11/2015 | Dehe et al. |
| 2005/0018864 A1* | 1/2005 | Minervini ............. B81B 7/0064 381/175 |
| 2010/0074458 A1 | 3/2010 | Lan et al. |
| 2015/0001647 A1 | 1/2015 | Dehe et al. |
| 2015/0063608 A1* | 3/2015 | Schelling ............. H04R 19/005 381/174 |
| 2016/0137486 A1 | 5/2016 | Bharatan |
| 2017/0247246 A1 | 8/2017 | Schelling et al. |

* cited by examiner

MEMS MICROPHONE SYSTEM

CROSS-REFERENCE TO RELATED APPLICATIONS

This application claims priority to U.S. Provisional Application Ser. No. 62/561,947 entitled "MEMS MICROPHONE SYSTEM" by Herms et al., filed Sep. 22, 2017, the disclosure of which is hereby incorporated herein by reference in its entirety.

TECHNICAL FIELD

The disclosure is directed toward microelectromechanical systems (MEMS) and, in particular, to MEMS microphones.

BACKGROUND

Previously known MEMS microphone chip designs included a fixed electrode formed by a thick, perforated epipoly layer, below which was a patterned polysilicon membrane with anchor structures and springs attached via oxide spacers. In order to fabricate such chips, the polysilicon and sacrificial oxide layers are deposited and then the latter are etched away by gas phase etching. Thus the membrane is released and free to move. However, the fabrication process resulted in the front side of the membrane being opened and susceptible to particle and moisture contamination.

Newer MEMS chips have been designed to be less susceptible to particle contamination. For example, a Pancake design (based on the "Steel City" approach) as been developed which uses two completely closed, flexible, mechanically coupled membranes with a polysilicon electrode in between. The displacement of the membrane due to sound pressure leads to capacity changes within the inner electrodes, which in turn can be read out from the ASIC.

The fabrication process for MEMS chips, according to the pancake approach, have typically required wet chemical etching processes to release the membranes. It is critical that the MEMS chip then go through a stiction-free drying process. Such drying processes can be complex and elaborate.

What is needed is a method of fabricating a particle-immune MEMS microphone chip that does not require wet chemical etching and that has additional advantages known MEMS microphone designs.

DETAILED DESCRIPTION

Figure 1:
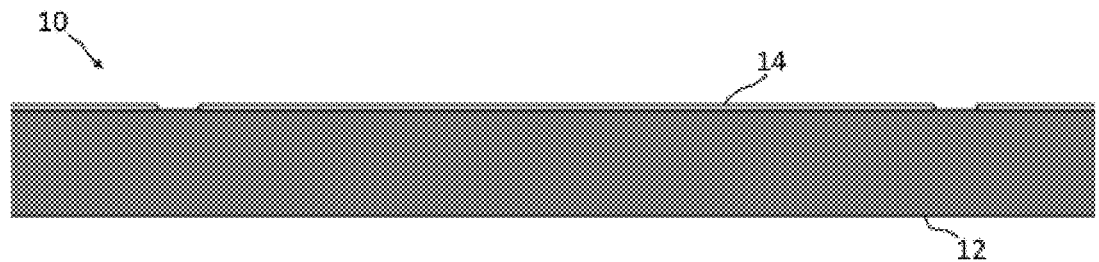
FIG. 1 is a schematic cross-sectional view of a wafer after a first oxide layer has been deposited thereon and patterned in a process of fabricating a MEMS microphone.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to a person of ordinary skill in the art to which this disclosure pertains.

The present disclosure is directed to a particle-immune MEMS microphone using a thin film approach and that uses silicon carbonitride (SiCN) material as membrane material. As an alternative to SiCN, silicon rich nitride (SiRiN) is also considered. As discussed below, the MEMS sensor includes a cavity which is enclosed by an "upper" and "lower" membrane and corresponding side walls. The cavity encapsulates the electrodes used for capacitive sensing in a vacuum. Encapsulating the electrodes in a vacuum between the closed membranes provides particle immunity and moisture insensitivity.

The electrodes are formed of a conductive material, such as polysilicon, and are supported on the upper and lower membranes which are formed of SiCN (or, alternatively, SiRiN). SiCN offers advantageous properties for MEMS microphones. SiCN is dense and resistant to HF acid etching which is the primary etchant used for oxides. Therefore, SiCN has high etching selectivity with regard to silicon oxide for end point detection. SiCN also has a tensile stress in the range of 100 Mpa-400 Mpa which fits well with the requirements of a MEMS-based microphone (estimated target value approx. 100-200 MPa tensile stress). The electrical layer resistance of SiCN has been measured in the range of 1019 Ω/sq at room temperature under a dry atmosphere. This high value is helpful when the mechanical components of a MEMS microphone are to be decoupled from the electrical functions.

Figure 2:
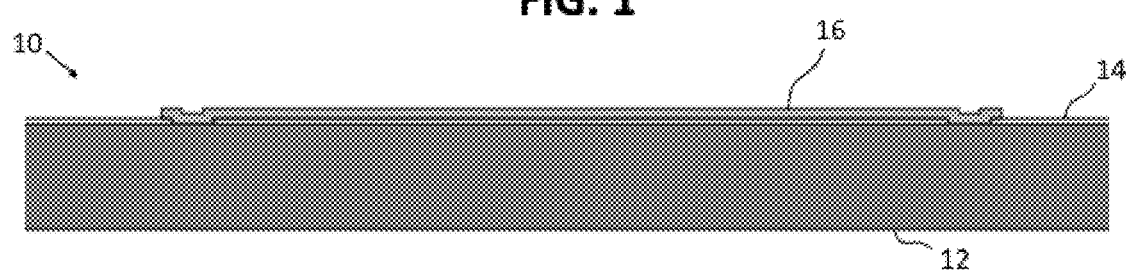
FIG. 2 is a schematic cross-sectional view of the wafer of FIG. 1 after a first SiCN membrane layer has been deposited onto the first oxide layer.

A thin film-based MEMS microphone 10 using SiCN as membrane material will now be described with reference to FIGS. 1-24. All the oxide and nitride layers discussed below are deposited to a thickness of approximately 250 nm-500 nm. The process begins with the deposition and patterning of a first oxide layer 14 on a substrate or wafer 12 as depicted in FIG. 1. A first SiCN layer 16 is then deposited onto the first oxide layer 14 to serve as a lower flexible membrane for the device 10 (FIG. 2).

Figure 3:
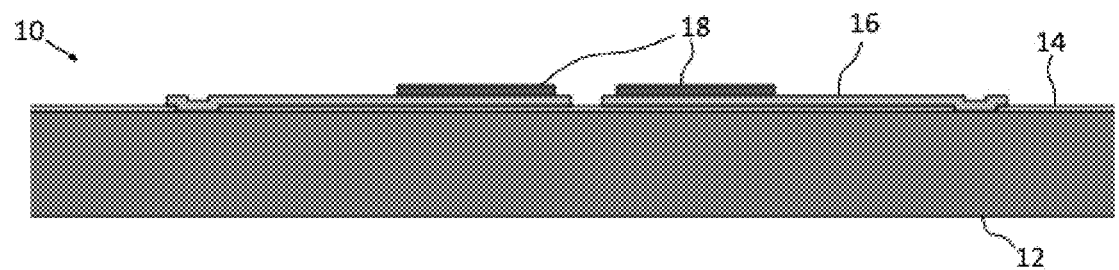
FIG. 3 is a schematic cross-sectional view of the wafer of FIG. 2 after a first polysilicon layer has been deposited onto the first SiCN layer and patterned to form first electrodes.
Figure 4:
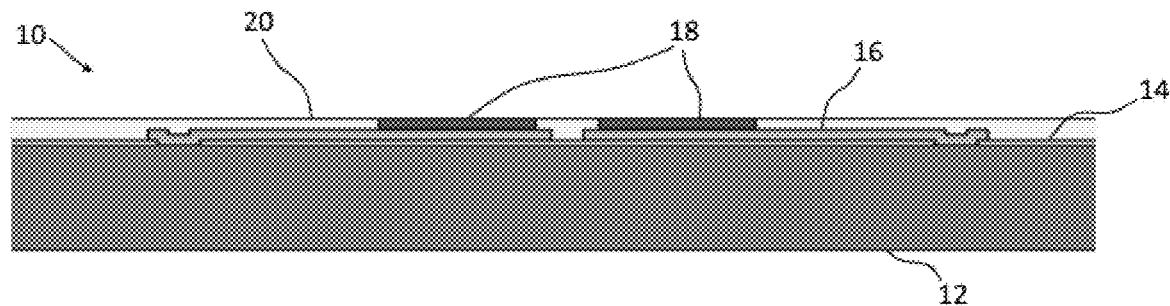
FIG. 4 is a schematic cross-sectional view of the wafer of FIG. 3 after a second oxide layer has been deposited thereon and polished.

A first polysilicon layer 18 is deposited onto the first SiCN layer 16 and patterned to form a first electrode on the lower membrane (FIG. 3). A second oxide layer 20 is then deposited onto the first oxide layer 14 and the first electrode 18. The second oxide layer 20 is polished to remove the oxide sitting on top of the first electrode 18 as can be seen in FIG. 4.

Figure 5:
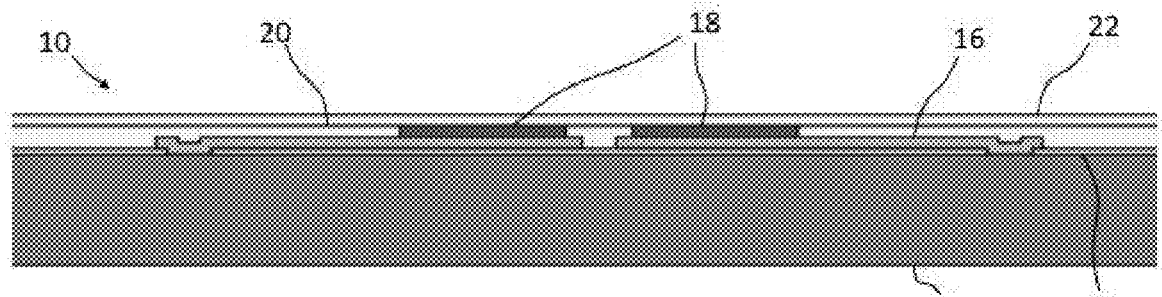
FIG. 5 is a schematic cross-sectional view of the wafer of FIG. 4 after a third oxide layer has been deposited thereon.
Figure 6:
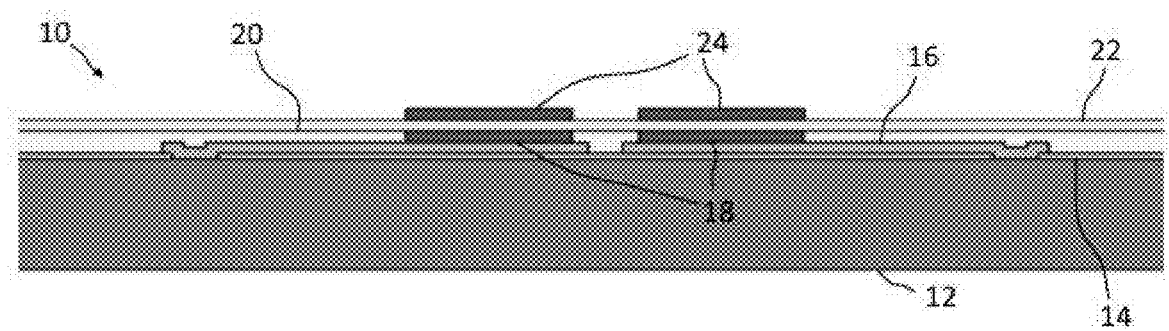
FIG. 6 is a schematic cross-sectional view of the wafer of FIG. 5 after a second polysilicon layer has been deposited thereon and patterned to form second electrodes.
Figure 7:
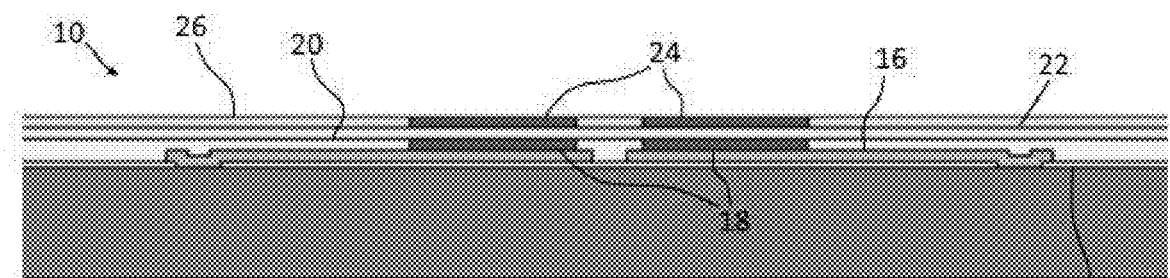
FIG. 7 is a schematic cross-sectional view of the wafer of FIG. 6 after a fourth oxide layer has been deposited thereon and polished.

Referring to FIG. 5, a third oxide layer 22 is deposited onto the second oxide layer 20. A second polysilicon layer 24 is then deposited onto the third oxide layer 22 and is patterned to form a second electrode (FIG. 6). A fourth oxide layer 26 is then deposited onto the third oxide layer 22 and the second electrode 24 which is polished to remove the portions of the oxide on the second electrode 24 (FIG. 7). The second electrode 24 is a counter electrode for the electrode 18 such that the first electrode 18 and second electrode 24 form a first capacitive sensor. The second oxide layer 22 in the regions between the electrodes 18, 24 and between the trenches 28 is a gap oxide for first capacitive sensor.

Figure 8:
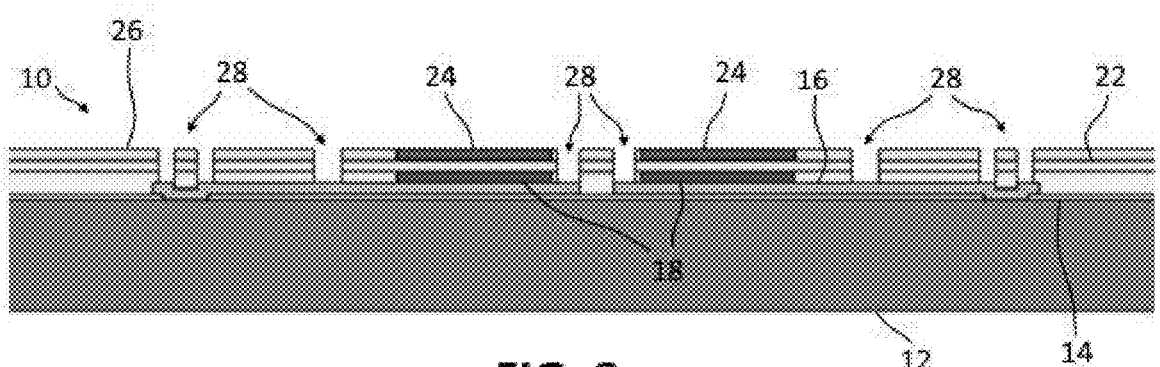
FIG. 8 is a schematic cross-sectional view of the wafer of FIG. 7 after trenches are formed down to the first SiCN layer.
Figure 9:
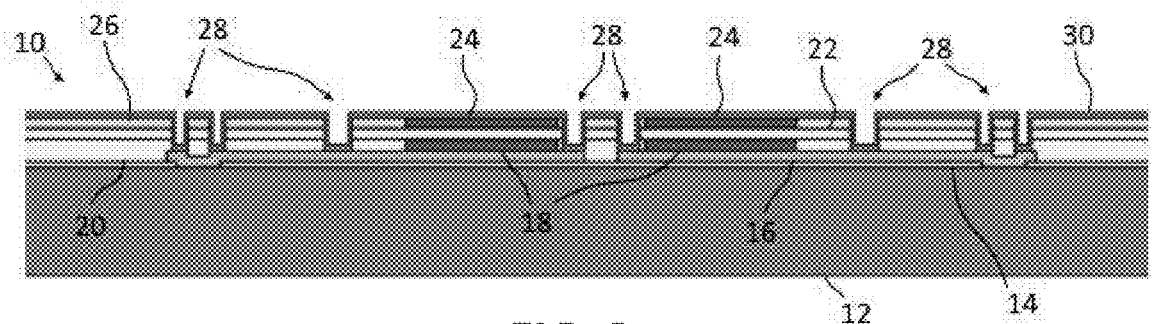
FIG. 9 is a schematic cross-sectional view of the wafer of FIG. 8 after a second SiCN layer has been deposited on the fourth oxide layer and on the walls of the trenches.

As depicted in FIG. 8, a patterning step is conducted to form a plurality of trenches 28 that extend through the oxide layers 20, 22, 26 down to the first SiCN layer 16. Referring now to FIG. 9, a second SiCN layer 30 is then deposited onto the fourth oxide layer 26. The second SiCN layer 30 is also deposited into the trenches 28 and lines the walls of the trenches 28 as can be seen in FIG. 9. The second SiCN layer 30 will support the second electrode 24 once the gap oxide has been removed to form a gap between the electrodes 18, 24.

Figure 10:
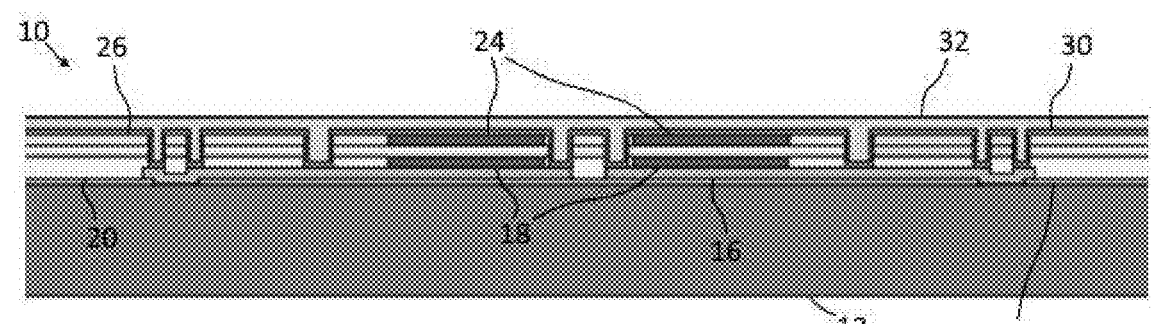
FIG. 10 is a schematic cross-sectional view of the wafer of FIG. 9 after a fifth oxide layer has been deposited thereon.
Figure 11:
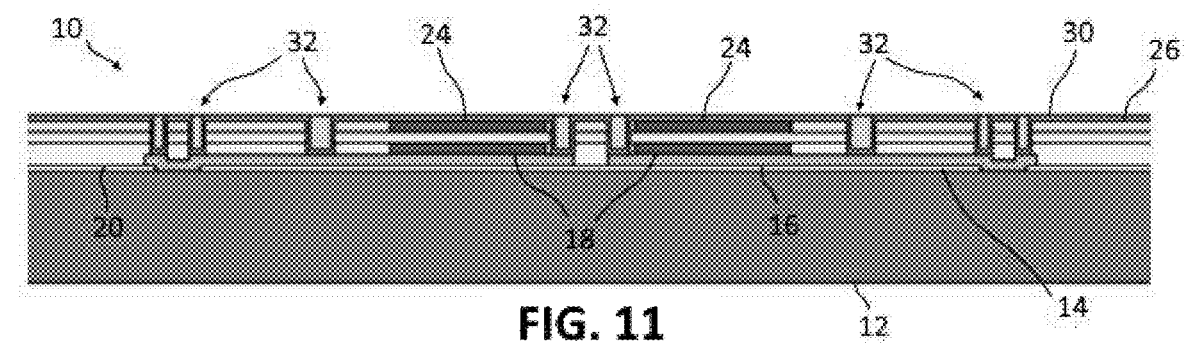
FIG. 11 is a schematic cross-sectional view of the wafer of FIG. 10 after a polishing step.
Figure 12:
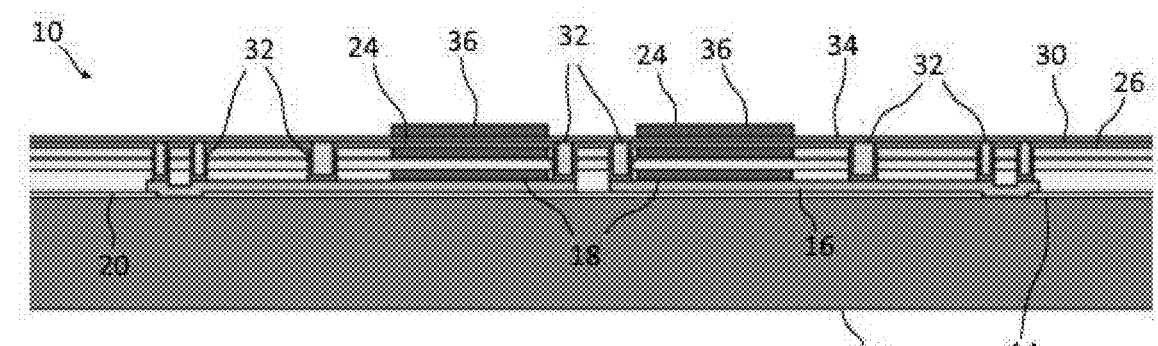
FIG. 12 is a schematic cross-sectional view of the wafer of FIG. 11 after a third SiCN layer has been deposited thereon and after a third polysilicon layer has been deposited thereon and patterned to form third electrodes.
Figure 13:
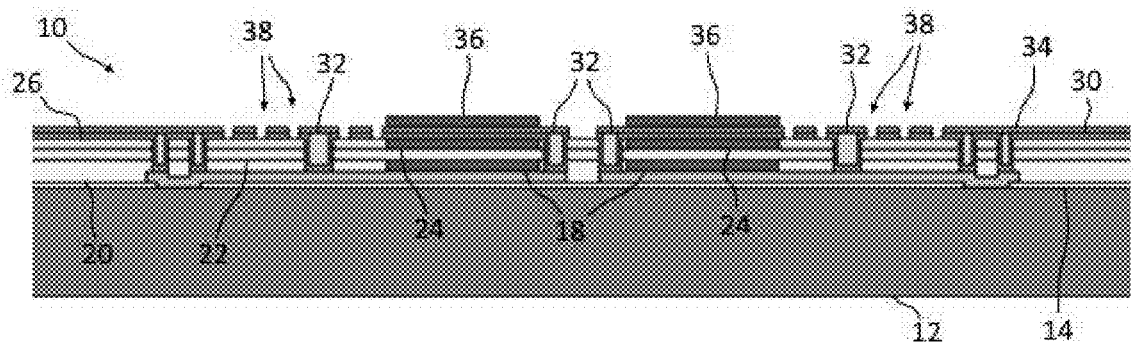
FIG. 13 is a schematic cross-sectional view of the wafer of FIG. 12 after perforating the second and third SiCN layers.

Referring now to FIG. 10, a fifth oxide layer 32 is deposited onto the second SiCN layer 30 to fill the trenches 28. The fifth oxide layer 32 is then polished so that only the oxide in the trenches 28 remains (FIG. 11). A third SiCN layer 34 is then deposited onto the second SiCN layer 30 and over the oxide filled trenches 28 (FIG. 12). A third polysilicon layer 36 is then deposited onto the third SiCN layer 34 and patterned to form a third electrode (FIG. 12). A patterning step is also conducted to form perforations 38 that extend through the second SiCN 30 and third SiCN 34 layers down to the fourth oxide layer 26.

Figure 14:
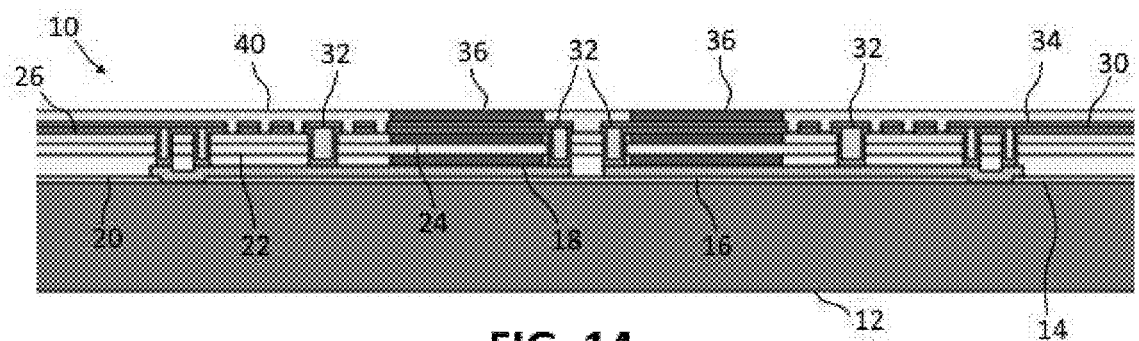
FIG. 14 is a schematic cross-sectional view of the wafer of FIG. 13 after a sixth oxide layer has been deposited thereon and polished.
Figure 15:
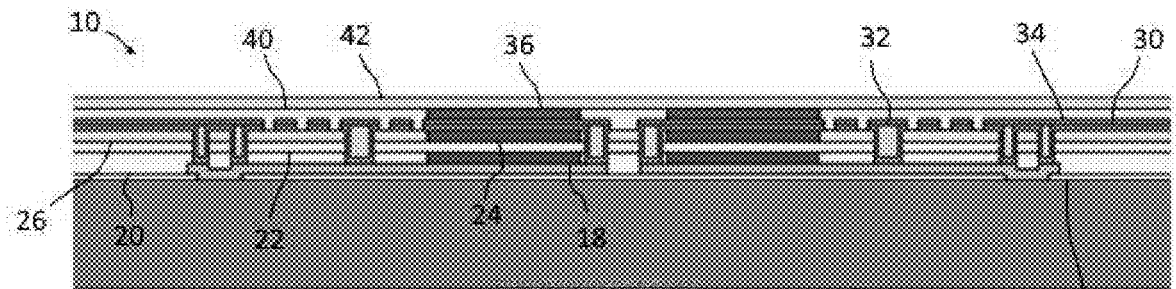
FIG. 15 is a schematic cross-sectional view of the wafer of FIG. 14 after a seventh oxide layer has been deposited thereon.

Referring now to FIG. 14, a sixth oxide layer 40 is deposited onto the third SiCN layer 34 and the third electrode 36. As can be seen in FIG. 14, the sixth oxide layer 40 is polished to remove the portions of the oxide on the third electrode 36. Referring to FIG. 15, a seventh oxide layer 42 is then deposited onto the polished sixth oxide layer 40 and the third electrode 36 (FIG. 15).

Figure 16:
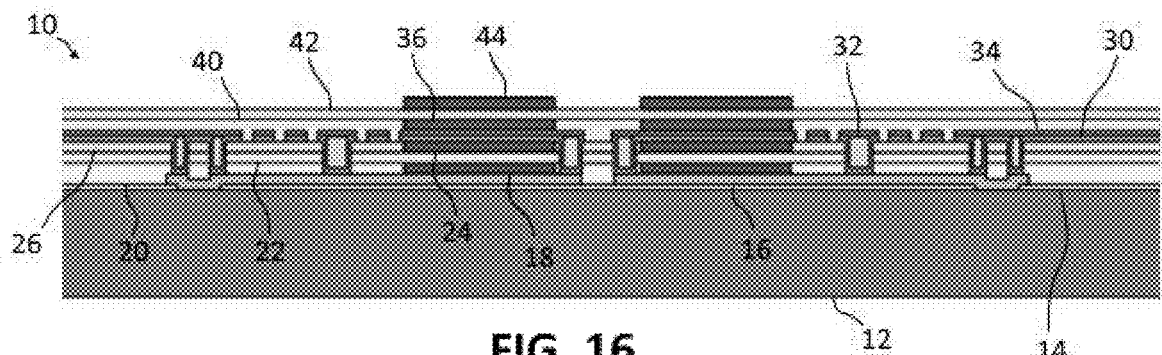
FIG. 16 is a schematic cross-sectional view of the wafer of FIG. 15 after a fourth polysilicon layer has been deposited thereon and patterned to form fourth electrodes.

A fourth polysilicon layer 44 is then deposited onto the seventh oxide layer and patterned to form a fourth electrode (FIG. 16). The second and third SICN layers 30, 34 form an intermediate membrane which is part of the counter electrode assembly. The third electrode 36 is supported on the third SiCN layer and is a counter electrode for the fourth electrode 44 such that the third electrode 36 and fourth electrode 44 form a second capacitive sensor. The seventh oxide layer 42 in the regions between the electrodes 36, 44 and between the trenches 28 is a gap oxide for second capacitive sensor.

Figure 17:
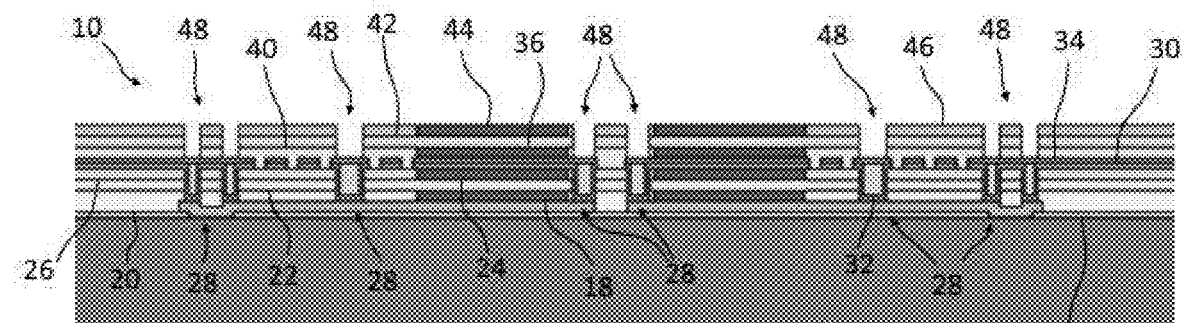
FIG. 17 is a schematic cross-sectional view of the wafer of FIG. 16 after a seventh oxide layer has been deposited thereon and trenches have been formed that extend down to the third SiCN layer.

Referring to FIG. 17, an eighth oxide layer 46 is deposited onto the seventh oxide layer 42 and the fourth electrode 44 and then polished. A patterning step is then conducted to form a plurality of trenches 48 that extend down to the third SiCN layer 34. The trenches 48 above the third SiCN layer 34 will be referred to herein as upper trenches, and the trenches 28 located between the first and second SiCN layers will be referred to herein as lower trenches. As can be seen in FIG. 17, each of the upper trenches 48 is aligned with a lower trench 28.

Figure 18:
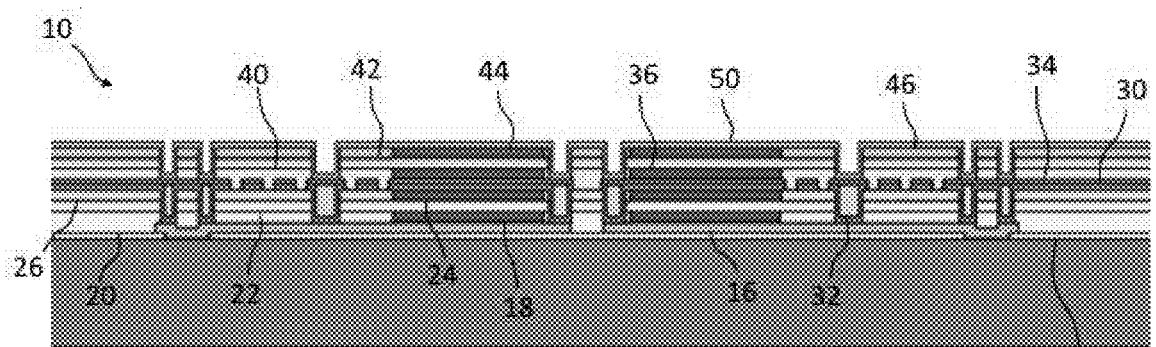
FIG. 18 is a schematic cross-sectional view of the wafer of FIG. 17 after a fourth SiCN layer has been deposited thereon.
Figure 19:
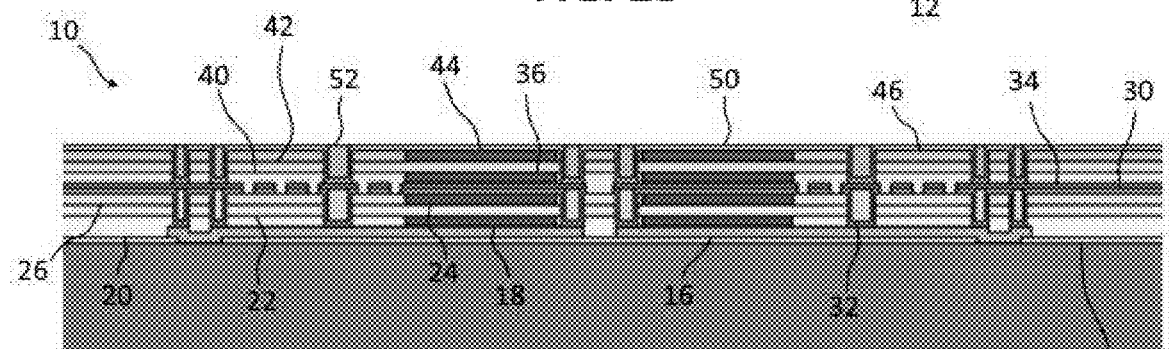
FIG. 19 is a schematic cross-sectional view of the wafer of FIG. 18 after an eighth oxide layer has been deposited thereon and polished.

A fourth SiCN layer 50 is then deposited onto the eighth oxide layer 46 and the fourth electrode 44 (FIG. 18). The fourth SiCN layer 50 is also deposited into the upper trenches 48 to line the walls of the trenches as can be seen in FIG. 18. A ninth oxide layer 52 is deposited onto the fourth SiCN layer 50 so as to fill the upper trenches 48 and polished so that only the oxide in the trenches remains.

Figure 20:
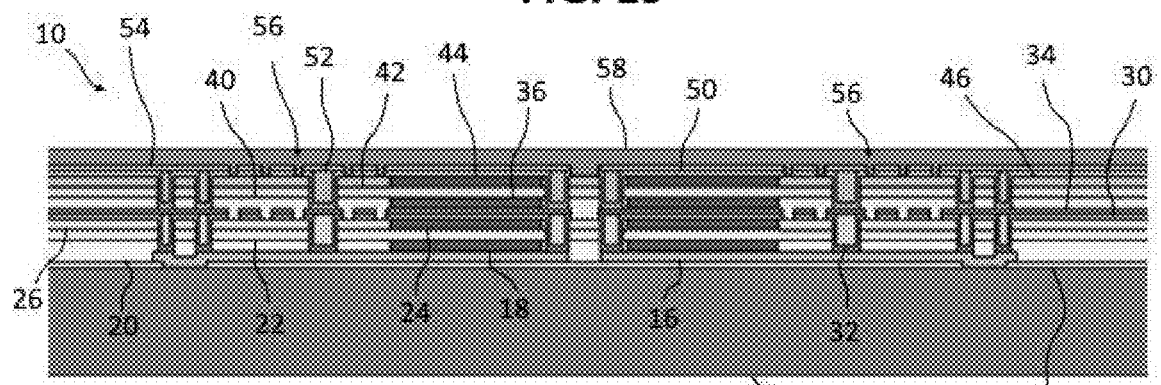
FIG. 20 is a schematic cross-sectional view of the wafer of FIG. 19 after a fifth SiCN layer has been deposited thereon and perforated and after a protective layer has been deposited on top of the fifth SiCN.
Figure 21:
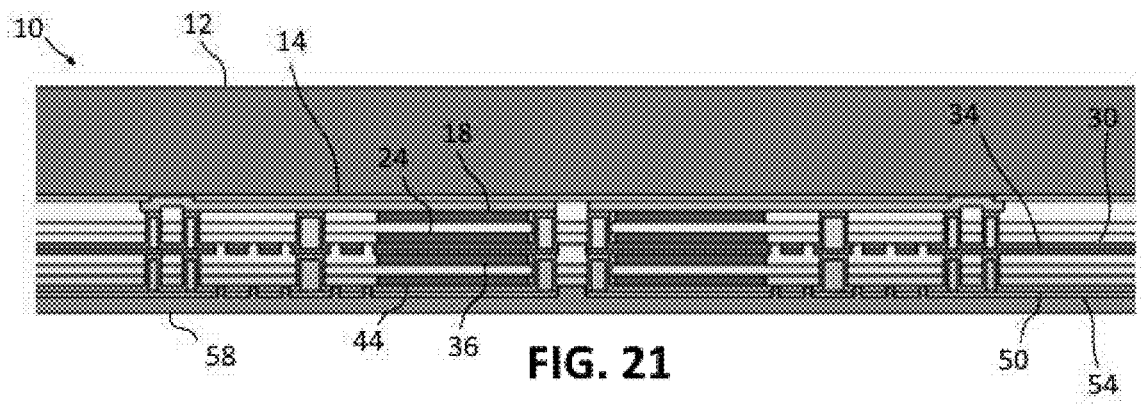
FIG. 21 is a schematic cross-sectional view of the wafer of FIG. 20 after the wafer has been flipped over.

Referring to FIG. 20, a fifth SiCN layer 54 is then deposited onto the fourth SiCN layer 50 and over the oxide filled upper trenches 52. The fourth and fifth SiCN layers form an upper membrane for the device. A patterning step is also conducted to form perforations 56 that extend through the fourth SiCN and fifth SiCN layers 50, 54 down to the eighth oxide layer 46. These perforations 56 will serve as etch access holes for etching the interior oxide in a later step. A thick oxide protection layer 58 is formed on the fifth SiCN layer 54 to protect the upper layers so that the wafer may be flipped over as can be seen in FIG. 21.

Figure 22:
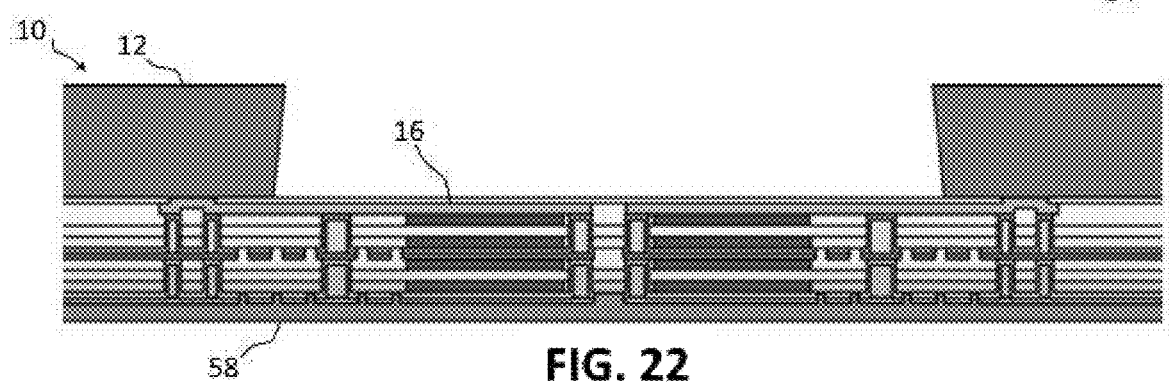
FIG. 22 is a schematic cross-sectional view of the wafer of FIG. 21 after a backside etching step.
Figure 23:
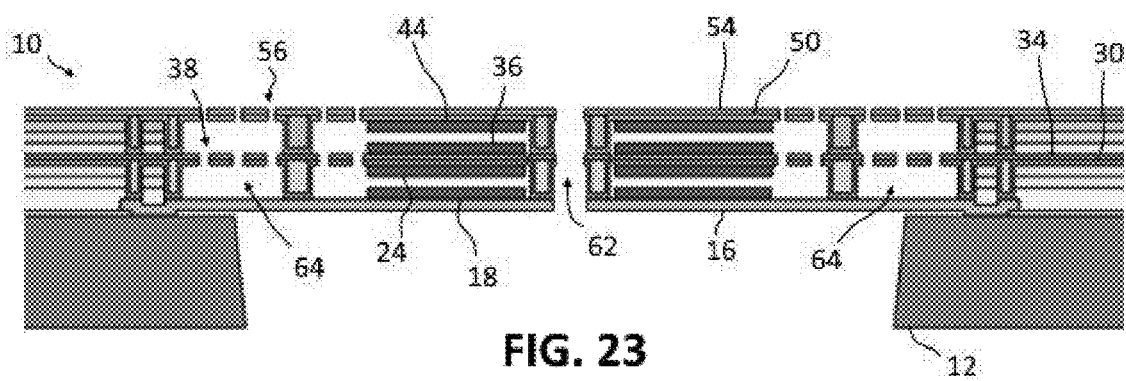
FIG. 23 is a schematic cross-sectional view of the wafer of FIG. 22 after an oxide etching step.

Once the device 10 has been flipped over, a backside etching process is performed which removes the portion of the wafer 12 below the active region to release the underside of the lower membrane 16 (FIG. 22). Referring now to FIG. 23, the device 10 is then flipped back over so that oxide etching may be performed to remove oxides including the gap oxide layers and other oxide layers from within the cavity 64. The etchant is introduced via the etch oxide holes 38, 56 in the SiCN layers 50, 54 using a gas phase etching process.

Figure 24:
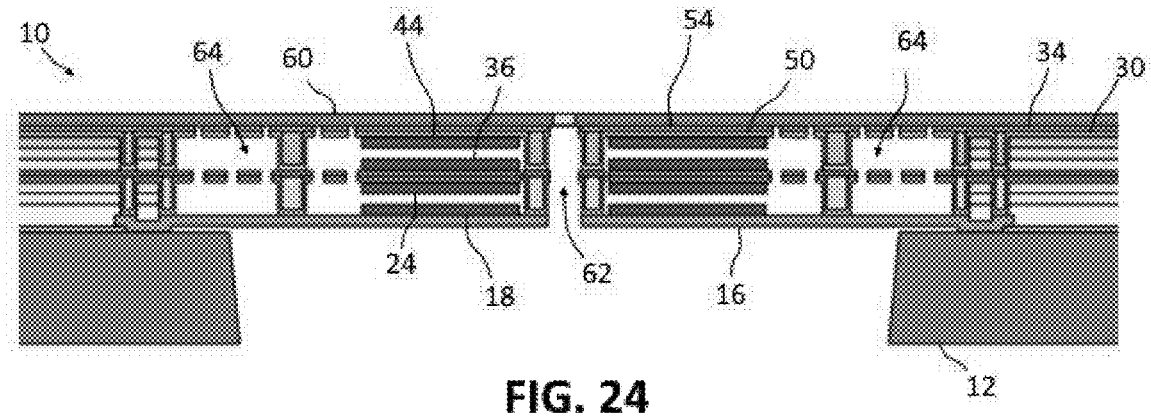
FIG. 24 is a schematic cross-sectional view of the wafer of FIG. 23 after depositing a nitride layer under low pressure to close the etch access holes

Referring to FIG. 24, a nitride protection layer 60 is then deposited over the fifth SiCN layer 54 under lower pressure, e.g., 1.3 mbar or less, to seal the etch access holes 56. This results in the cavity being sealed with a low pressure atmosphere that is also 1.3 mbar or less.

As can be seen in FIGS. 23 and 24, the removal of the oxide from between the center-most oxide filled trenches forms a channel 62 that extends though the upper and lower membranes. This channel 62 serves as a leak hole for barometric pressure equalization and for controlling the frequency behavior of the device.

The upper membrane (SiCN layers 50, 54) and lower membrane (SiCN layer 16) close both sides of the device thereby encapsulating the cavity 64 in which the capacitor electrodes 18, 24, 36, 44 are located. Since the lower membrane and the upper membrane are substantially non-porous, at least with respect to dust particles and moisture, the device is particle immune and moisture insensitive. The oxide filled trenches 28, 48 are aligned to form pillars within the cavity which maintain spacing between the membranes. The pillars in conjunction with the use of SiCN support layers enable wider device geometries.

Please note that the process depicted and described with reference to FIGS. 1-24 should not be considered as limiting to the overall process. Additional steps or few steps may be used. Additional layer deposition and patterning steps may be included for various reasons, such as readout circuitry, other device fabrication and the like.

As noted above, all the oxide and nitride layers are deposited to a thickness of approximately 250 nm-500 nm. The SiCN may be deposited using a chemical vapor deposition process such as plasma-enhanced chemical vapor deposition (PECVD) or low pressure chemical vapor deposition (LPCVD). The oxide may be deposited in any suitable manner. The SiCN may be structured using a gas phase etching process with a sulfur hexafluoride (SF6) based etching material. The structuring of the oxide layers can also be carried out using HF etching, as well as plasma or wet chemical etching processes, depending on the manufacturing tolerances provided in the design.

SiRiN may be used as an alternative to SiCN in the process described in FIGS. 1-24. The primary difference between the use of SiCN as described above and the use of SiRiN for the membrane layers is that the release of the membrane with the backside etching process would likely have to be carried out by wet chemical etching rather than gas phase etching. If wet chemical etching is used, a stiction-free drying process must be used to dry the device.

The thin film approach using SiCN membranes for MEMS microphones described above provides a number of advantages over previously known devices and processes. For example, the HF resistance of the SiCN material allows the membrane to be released using a state-of-the-art gas phase etching process. A wet etching release process with a very elaborate, stiction-free drying process requirement is omitted.

Compared to the polysilicon membranes in current microphone processes, electrical functions are decoupled from the mechanical membrane. As a result, electrical supply lines become smaller, which reduces the combined electrical parasitic impedance. Moreover, by decoupling the electrode and the mechanical membrane, a simple realization of multiple electrodes per membrane is obtained, which allows for extended functionalities (different sensitivity ranges for high-SPL, possibly pressure sensor functions, etc.).

Wafer processing in previously known particle-immune microphone fabrication processes typically require about 35 mask planes. The process described above requires about 16 mask planes so the process i may be performed with less complexity than previously known processes. Compared to other particle-immune microphone designs (e.g., "Steel City-Pancake" approach), the tensile strength of SiCN layers can be used to reduce the induced stress-gradient asymmetries in the evaluation capacities. The use of SiCN also enables a reduction of mechanical asymmetries within the MEMS by using tensile (SiCN) rather than compressive materials and avoiding high-temperature epitaxy processes.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:
1. A MEMS microphone comprising:
   a substrate;
   a flexible lower membrane supported on the substrate;
   a flexible upper membrane suspended above the lower membrane;
   a first electrode supported on the lower membrane;
   a second electrode supported on the upper membrane; and
   a counter electrode assembly within the cavity, the counter electrode assembly including:
      an intermediate membrane extending between the lower membrane and the upper membrane,
      a third electrode on a first side of the intermediate membrane facing the first electrode, and
      a fourth electrode on a second side of the intermediate membrane facing the second electrode,
   wherein the first electrode and the third electrode form a first capacitive sensor and the second electrode and the fourth electrode form a second capacitive sensor,
   wherein the lower membrane and the upper membrane enclose a cavity in which the first electrode and the second electrode are located, the lower membrane and the upper membrane each being closed and nonporous to prevent dust particles and moisture from entering the cavity,
   wherein the lower membrane and the upper membrane are each formed of silicon carbonitride (SiCN), and
   wherein the first electrode and the second electrode are each formed of polysilicon.

2. The MEMS microphone of claim 1, wherein the lower membrane, the upper membrane, the first electrode and the second electrode are each formed of at least one thin film, each thin film of the lower membrane, the upper membrane, the first electrode and the second electrode having a thickness of approximately 250 nm to approximately 500 nm.

3. The MEMS microphone of claim 1, wherein the intermediate membrane is formed of SiCN and
   wherein the third electrode and the fourth electrode are each formed of polysilicon.

4. The MEMS microphone of claim 1, wherein at least one of the upper membrane and the lower membrane includes etch access holes via which an etchant was introduced into the cavity during a fabrication process, and
   further comprising:
      a nitride layer deposited onto the at least one of the upper membrane and the lower membrane having the etch access holes to seal the etch access holes,
   wherein the nitride layer is deposited at a low pressure, the low pressure being approximately 1.3 mbar or less.

5. The MEMS microphone of claim 1, further comprising:
   a leak hole channel that extends through the upper membrane and the lower membrane.

6. The MEMS microphone of claim 1, further comprising:
a plurality of pillars that extend from the upper membrane to the lower membrane, each of the pillars having walls formed of SiCN surrounding an oxide core.

* * * * *